United States Patent [19]

Kelly

[11] Patent Number: 4,652,854
[45] Date of Patent: Mar. 24, 1987

[54] PRESSURE-BIASED, TEMPERATURE SENSOR

[75] Inventor: Robert R. Kelly, Hoffman Estates, Ill.

[73] Assignee: Borg-Warner Corporation, Chicago, Ill.

[21] Appl. No.: 728,735

[22] Filed: Apr. 30, 1985

[51] Int. Cl.[4] .............................................. B60Q 1/00
[52] U.S. Cl. ................................... 340/60; 200/83 D; 200/81.5
[58] Field of Search ............ 340/60; 200/83 A, 83 D, 200/83 C, 83 R, 81.5, 82 C, 81.4; 92/37, 38, 34, 36, 40

[56] References Cited

U.S. PATENT DOCUMENTS

| | | | |
|---|---|---|---|
| 1,815,642 | 7/1931 | Zubaty | 236/34 |
| 1,933,453 | 10/1933 | Schlaich | 177/351 |
| 2,427,426 | 9/1947 | Swenson et al. | 200/81.5 |
| 2,825,781 | 3/1958 | Mitchell | 200/81.5 |
| 2,834,953 | 5/1958 | Bechberger et al. | 340/60 |
| 2,859,761 | 11/1958 | Bottoms | 92/37 |
| 3,338,099 | 8/1967 | Remick, Jr. et al. | 73/345 |
| 3,439,356 | 4/1969 | Kinzer | 340/626 |
| 3,766,834 | 10/1973 | Kraemer | 200/83 C X |
| 4,051,728 | 10/1977 | Metz | 73/343 R |

Primary Examiner—Glen R. Swann, III
Assistant Examiner—Jeffery A. Hofsass
Attorney, Agent, or Firm—Florian S. Gregorczyk; John W. Harbst

[57] ABSTRACT

A pressure-biased, temperature sensor for monitoring a fluid system for either an over-temperature or under-pressure condition. These conditions are sensed by one of two expandable bellows operators which cooperates with the other bellows operator and a lever and fulcrum arrangement to close a switch, completing a signal circuit and energizing a signal means.

6 Claims, 4 Drawing Figures

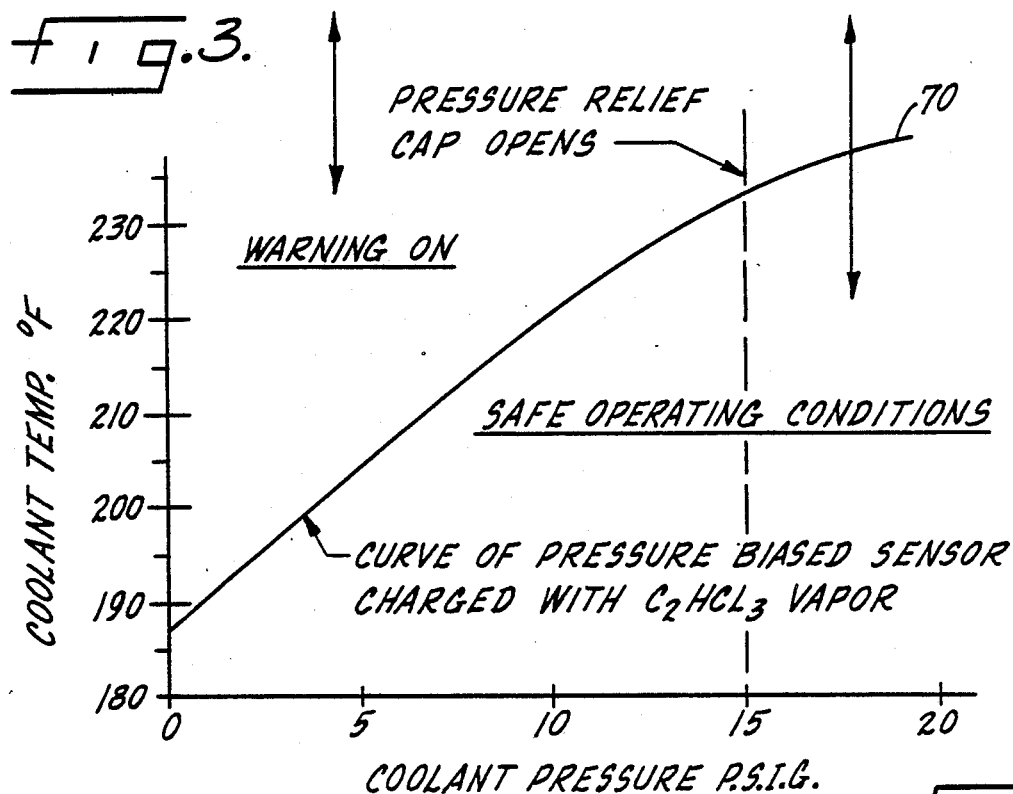
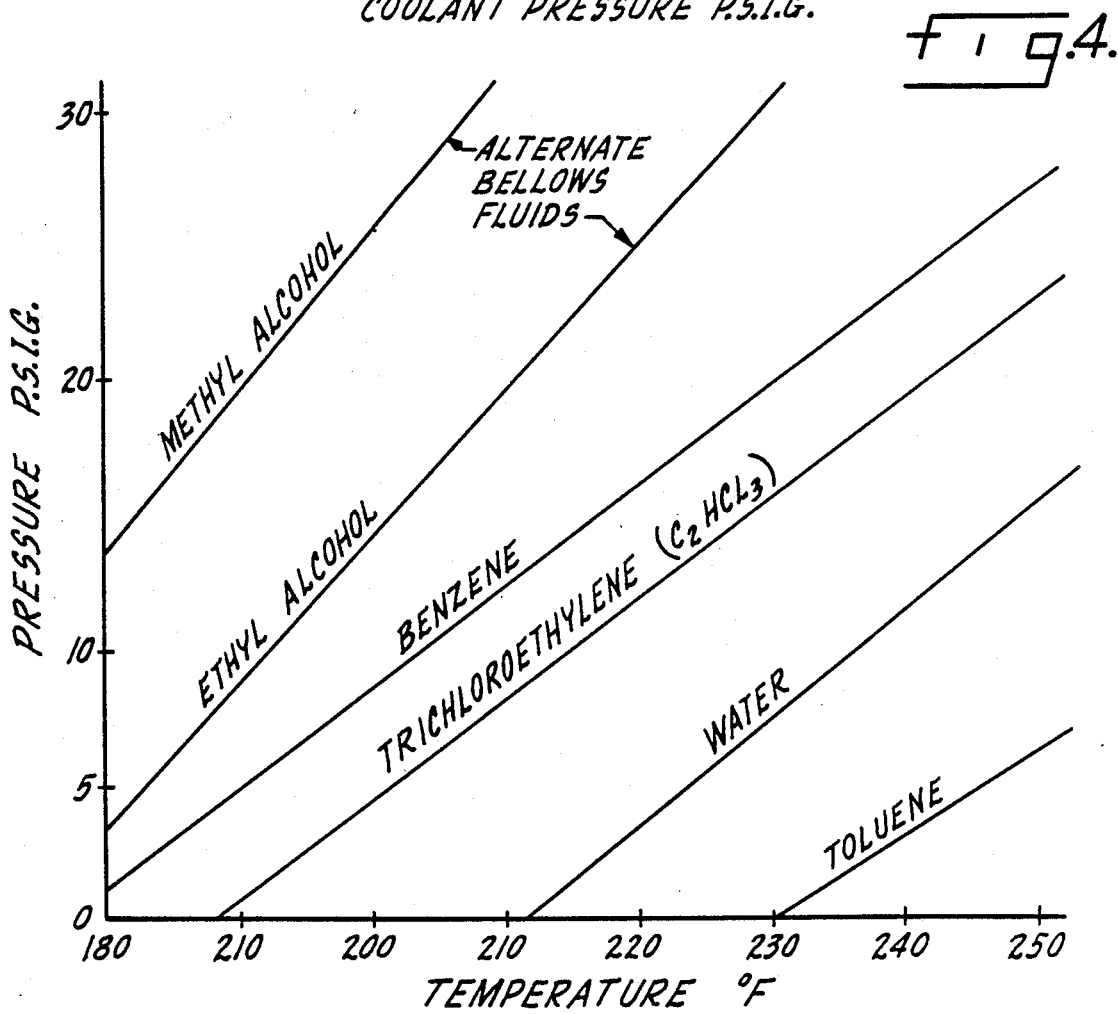

PRESSURE-BIASED, TEMPERATURE SENSOR

BACKGROUND OF THE INVENTION

1. Field of the Invention

This invention discloses a multiple function sensing means for a fluid system. More specifically, this invention relates to a sensor for a vehicular coolant system. The sensor is a relatively compact structure to monitor under-pressure and over-temperature conditions in a coolant system, and provides a signal means indicative of a malfunction. Coolant can boil away at normal operating temperatures if the system is open, such as with a ruptured hose or a loose radiator cap.

2. Prior Art

Monitoring devices and sensors for fluid systems are known in the art, particularly temperature sensing apparatus for automobile coolant systems. There have been efforts to provide both over pressure and over-temperature sensing devices, but not an under-pressure and over-temperature sensor. Indicative of this prior art is U.S. Pat. No. 3,439,356 (Kinzer) which discloses a pressure-temperature sensor. In this apparatus opposed bellows chambers are coupled by a movable electrically conducting disc, which is displaced between a tube end and a thermocouple junction. The disc is moved to contact the thermocouple switch to energize a signal means and thereafter the disc is adjusted with a fluid at a known pressure to disclose an accurate pressure reading. The thermocouple is utilized in a known fashion to yield the temperature of a surrounding fluid.

U.S. Pat. No. 1,933,453 (Schlaich) teaches an indicating device responsive to both temperature and pressure. However, this device requires a coil resistor 13, a temperature coil shown as bimetal coil 16, and a diaphragm operator 24. The diaphragm operator 24 is responsive to an excess pressure to open a circuit. This device provides a current from a battery (not shown) to the end of resistor coil 13 and wiper 14 which is operable by diaphragm 24. The temperature actuation, although reasonably accurate at most temperatures, is inadequate to move the indicator for its entire distance or stroke. However, at an overheated condition sufficient for the liquid to boil vigorously, an excess pressure is disclosed that will actuate the diaphragm to move the indicator for substantially its entire travel range. A drawback noted in this device is, that until vigorous boiling occurs, the thermometer or temperature indicator does not accurately indicate the water temperature due to the difference between the water temperature and air temperature of the space surrounding the temperature responsive instrument.

U.S. Pat. No. 3,338,099 (Remick, Jr., et al) teaches a boiling point indicator which utilizes two sensors, one for pressure and one for temperature. A diaphragm operator moves a mechanical indicator. There is no teaching of an electrical signal provided for such readings. This particular device is operable only as an indicator of a safe-unsafe temperature.

U.S. Pat. No. 4,051,728 (Metz) teaches an instrument for monitoring a physical parameter, either temperature or pressure, utilizing an elastic sensor displaceable as a function of the monitored physical parameter. However, it is capable of only monitoring one parameter at a time. The device requires a belt having characteristics which change along the length thereof. The elastic sensor is responsive to the belt characteristic to produce an output signal which varies as a function of the physical parameter being monitored. Such a device is impractical for most automotive or vehicular usages.

Illustrative of early efforts at monitoring fluid bath temperatures in U.S. Pat. No. 1,815,642 (Zubaty) illustrating a bellows filled with a heat responsive fluid, which bellows is immersed in a fluid bath. A mechanical arm is connected between the bellows and a temperature indicator. As the fluid within the bellows is heated, the bellows is permitted to expand to move the mechanical arm and indicate the temperature. There is no teaching or consideration of pressure measurement.

Most vehicle coolant systems are operated at an elevated pressure which permits them to operate at a higher temperature. Generally these coolant systems are provided with relief valves to protect against an over-pressure condition. At a lower pressure the coolant will boil and evaporate from the system at a lower temperature. Therefore, it is vital to be forewarned of an under-pressure condition as well as an over-temperature condition in these coolant systems.

The above devices, which require immersion in or communication with a fluid to sense either over temperature or over pressure, do not provide a means for measuring both an over-temperature condition and an under-pressure condition. The under-pressure condition exists when the system fluid pressure is lost from a cooling system, such as through a loose radiator cap.

SUMMARY OF THE INVENTION

A pressure-biased, temperature sensor constructed in accordance with the invention includes a housing, having a wall structure with a mounting wall, and defining a fluid port, a vent port and a chamber therein. A first bellows filled with a heat responsive fluid is mounted in the chamber on the mounting wall, and a second bellows with a passage to communicate to the bellows cavity is also mounted on the mounting wall. A fulcrum and lever means is connected to both bellows and the lever is operable in response to an over-temperature or under-pressure condition to close a switch means, thus completing a signal circuit and energizing a signal means. The switch means may be either inside or outside the chamber. The sensor provides a low pressure bias to the over temperature alarm.

BRIEF DESCRIPTION OF THE DRAWING

In the figures of the drawing, like reference numerals identify like components, and in the drawing:

FIG. 3 is a graphical illustration of an operating curve for a pressure-biased, temperature sensor; and FIG. 4 illustrates a family of vapor pressure-temperature curves for various fluids utilized in sensors.

DETAILED DESCRIPTION OF THE INVENTION

Figure 1:
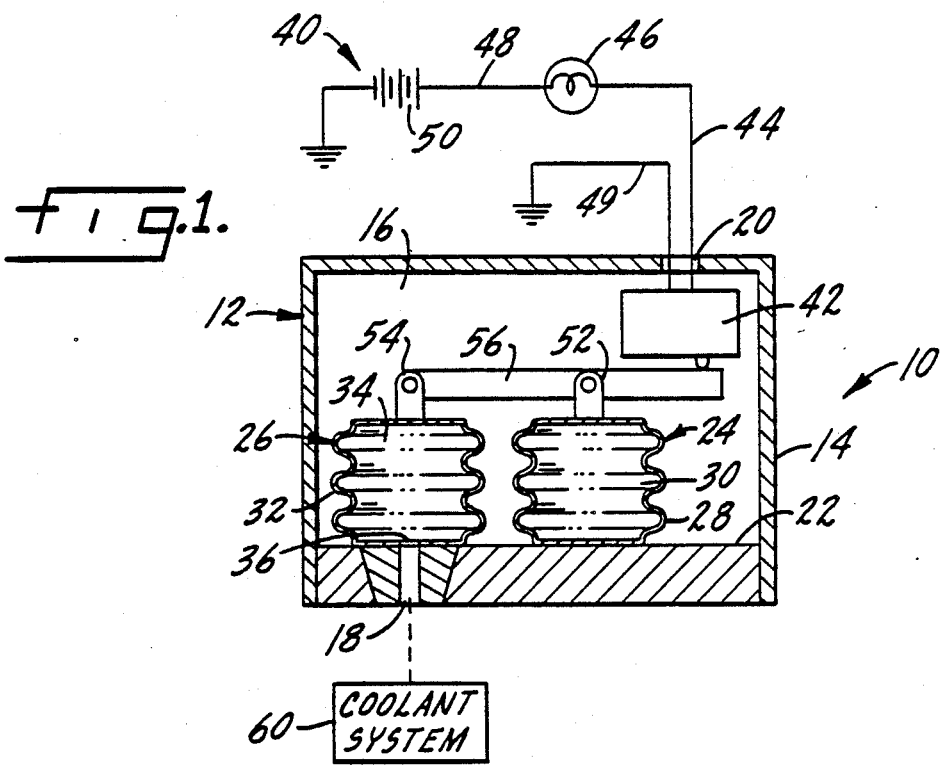
FIG. 1 is a cross-section of a schematic illustration of a pressure-biased, temperature sensor.

In FIG. 1 a pressure-biased, temperature sensor 10 is shown with a housing 12 having a wall 14 defining a chamber 16, a fluid port 18 and a vent port 20. Vent port 20 provides a reference pressure communication to chamber 16, shown as atmospheric pressure in FIGS. 1 and 2. Housing 12 includes a mounting wall 22 through which fluid port 18 communicates. Mounted on wall 22 in chamber 16 are a first bellows operator 24 and a second bellows operator 26. First bellows operator 24 has a wall 28 defining a sealed fluid cavity 30 which contains a temperature responsive fluid. Second bellows operator 26 has a wall 32 defining a pressure cavity 34 and a passage 36. Passage 36 communicates between pressure cavity 34 and fluid port 18. A signal circuit 40, as shown in FIG. 1, is a series circuit having a switch means 42 positioned in chamber 16, a first conductor 44 connected between a signal means 46 and said switch means 42, and a second conductor means 48 connected between signal means 46 and a grounded energy source 50. A third conductor 49 is connected between switch means 42 and ground. A source of energy 50 for this circuit is provided and is shown connected to second conductor means 48.

Positioned on first bellows operator 24 in chamber 16 of FIG. 1 is a first fulcrum operator or means 52. Similarly positioned or mounted to second bellows operator 26 in chamber 16 is a second fulcrum operator or means 54. Extending between first fulcrum means 52 and second fulcrum means 54 and further contacting switch means 42 is a lever 56.

As shown in FIG. 1, fluid port 18 is illustrated connected by a dotted line to a coolant or fluid system 60, such as the coolant system of a fluid cooled engine. Coolant system 60 is representative of the fluid coolant system. Engines include engine blocks (not shown) and mounting plate 22 may be positioned on an engine block to provide heat transfer across plate or mounting wall 22 and also to mate fluid port 18 and passage 36 to communicate fluid from fluid system 60 into cavity 34 of second bellows operator 26. Heat transfer from coolant system 60 is communicated through the engine block, and mounting plate 22 to first bellows operator 24. The vapor in fluid cavity 30 of bellows 24 responds to temperature and expands to move bellows operator 24. In FIG. 1 as the temperature increases above a predetermined point, bellows operator 24 expands and moves lever 56 generally pivoting it on fulcrum 54 to close switch means 42 thereby completing circuit 40 and energizing signal means 46. Similarly, at an elevated temperature and with a loss of fluid in coolant system 60; that is, an under-pressure condition in the coolant system, a similar loss of fluid is experienced in pressure cavity 34 of second bellows operator 36. A loss of fluid in pressure cavity 34 causes bellows operator 26 to contract due to the bellows' spring force or other reference pressure introduced through vent port 20. Contraction of bellows 26 pivots lever 56 about fulcrum 52, closes switch means 42, completes circuit 40 and energizes signal means 46. Heat transfer across mounting wall 22 may be dependent upon the coefficient of heat transfer of a particular material. However, fluid communication from fluid system 60 is only provided through fluid port 18 to pressure cavity 34.

Figure 2:
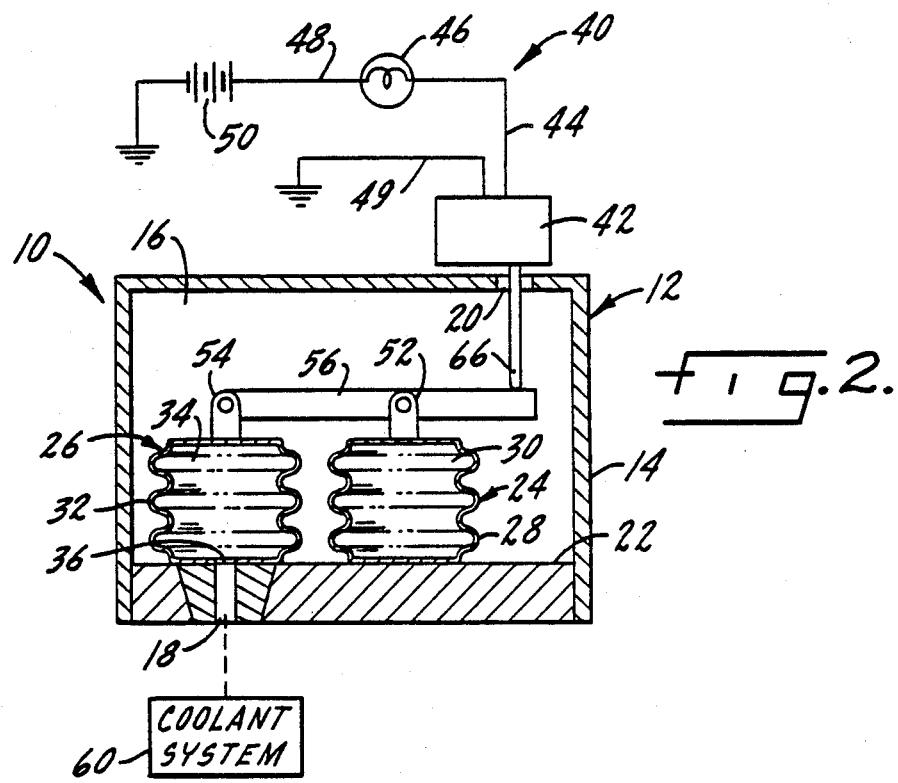
FIG. 2 is an alternative embodiment of a pressure-biased, temperature sensor arrangement.

FIG. 2 illustrates an alternative embodiment of the present invention wherein switch means 42 is positioned outside chamber 16. A projection or switch port, illustrated as vent port 20, provides a communication path between lever 56 and switch means 42. A projection bar 66 contacts lever 56 and switch means 42 to provide or actuate switch means 42 in response to movement of lever 56 by bellows operators 24 or 26.

In FIGS. 1 and 2, bellows 24 and 26 are in a reference position and switch means 42 is a normally open switch in a series circuit 40 with a first conductor means 44, signal means 46 and second conductor means 48. In this reference position, bellows 24 and 26 are at equilibrium.

As the temperature of the fluid in fluid system 60 increases, the vapor pressure within bellows operator 26 increases as does the temperature of the vapor in bellows operator 24. FIGS. 3 and 4 illustrate change in the vapor temperature and pressure. In FIG. 3 a curve 70 illustrates the change of pressure as a function of temperature for a given vapor fluid and notes an area below the curve termed the "safe operating condition". Below the curve, the bellows 24 and 26 remain contracted to maintain the open circuit of FIGS. 1 and 2. However, above the curve, in the area noted as "warning on", the vapor expands in bellows 26 and, as long as the coolant remains in the system, bellows 24 expands due to the increased temperature increasing the vapor pressure within bellows 24. As bellows 24 expands, lever arm 56 is pivoted on fulcrum 54 to close switch means 42 and circuit 40 to thereby energize signal means 46.

In addition to the temperature effect, a drop in fluid pressure within the coolant system at a given temperature will likewise effect the expansion or contraction of bellows 26. A loss of coolant results in a decrease in the fluid pressure within bellows 26 and it is balanced by the surrounding reference pressure and the bellows spring force to pivot or move lever arm 56 about fulcrum 52 closing switch means 42 and completing circuit 40 to energize signal means 46. FIG. 4 illustrates a family of curves for various liquids that may be provided to bellows 24. These curves demonstrate the change in vapor pressure with changing temperatures. Therefore, a given response can be provided either by altering the fluid bellows 24 or the bellows reaction rate.

Those skilled in the art will recognize that certain variations can be made in the illustrated embodiments. While only specific embodiments of the invention have been described and shown, it is apparent that various alterations and modifications can be made therein. It is, therefore, the intention in the appended claims to cover all such modifications and alterations as may fall within the true scope and spirit of the invention.

I claim:

1. A pressure-biased, temperature sensor means for a fluid system through which fluid flows, said sensor means comprising:

a housing having a wall and defining a chamber, a fluid port and a vent port;

said wall including a mounting wall;

a first bellows operator (FBO) with a heat responsive fluid sealed therein and a first fulcrum means mounted on said FBO;

a second bellows operator (SBO) defining a cavity and a communicating passage, and having a second fulcrum means mounted on said SBO;

said fluid port and SBO passage cooperating to provide fluid communication between said fluid system and said SBO cavity;

a signal circuit having a signal means, a switch means, a first conductor connected between said switch means on one side of said signal means, and a second conductor connected between said switch means and the second side of said signal means one of said conductors being connected to a source of electrical energy and said switch means being operable to complete the signal circuit when closed;

a lever contacting said switch means and connected to both said FBO fulcrum and said SBO fulcrum which FBO and SBO are operably responsive when the fluid in said fluid system falls below a predetermined temperature or when the same fluid in said fluid system rises above a predetermined pressure to pivot said lever in a manner closing said switch means whereby completing said signal circuit and thereby energizing said signal means.

2. A pressure-biased, temperature sensor as claimed in claim 1, wherein said switch means is positioned in said housing chamber.

3. A pressure-biased, temperature sensor as claimed in claim 1, wherein said switch means is positioned outside said housing and said wall defines a switch port; and
   a bar projection extends between said lever and said switch means through said switch port to actuate said switch means in response to movement of said FBO and SBO.

4. A pressure-biased, temperature sensor as claimed in claim 3, wherein said vent port provides communication for said bar projection.

5. A pressure-biased, temperature sensor as claimed in claim 1, wherein said fluid system is an engine coolant system.

6. A pressure-biased, temperature sensor as claimed in claim 5, wherein said engine includes an engine block and said mounting plate is positioned on said engine block.

* * * * *